US012719030B2

(12) United States Patent
Chadha et al.

(10) Patent No.: US 12,719,030 B2
(45) Date of Patent: Aug. 25, 2026

(54) SUSCEPTOR HEAT TRANSFER

(71) Applicant: Applied Materials, Inc., Santa Clara, CA (US)

(72) Inventors: Arvinder Manmohansingh Chadha, San Jose, CA (US); Syed Nazmul Ahsan, Folsom, CA (US); Glen T Mori, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 367 days.

(21) Appl. No.: 18/236,201

(22) Filed: Aug. 21, 2023

(65) Prior Publication Data

US 2025/0069864 A1 Feb. 27, 2025

(51) Int. Cl.
*H01J 37/32* (2006.01)

(52) U.S. Cl.
CPC ... *H01J 37/32724* (2013.01); *H01J 2237/002* (2013.01)

(58) Field of Classification Search
CPC .............. C23C 16/463; H01J 2237/002; H01J 37/32724; H01J 37/32715; H01L 21/6831; H01L 21/68785; H01L 21/67248; H01L 21/68792
See application file for complete search history.

(56) References Cited

U.S. PATENT DOCUMENTS

2003/0052118 A1* 3/2003 Ramanan .......... H01L 21/67103 219/444.1
2008/0037194 A1 2/2008 Kamitani et al.
2011/0222038 A1 9/2011 Yamashita
2017/0229326 A1* 8/2017 Tran .................. H01L 21/68792

FOREIGN PATENT DOCUMENTS

CN 108682613 A * 10/2018 ........... H01L 21/027
CN 108682613 B 2/2021

OTHER PUBLICATIONS

English translation CN108682613 (Year: 2018).*
International Search Report and Written Opinion for International Application No. PCT/US2024/012375, mailed May 23, 2024, 10 Pages.

* cited by examiner

*Primary Examiner* — Jason L Vaughan
*Assistant Examiner* — Amanda Kreiling
(74) *Attorney, Agent, or Firm* — Lowenstein Sandler LLP

(57) ABSTRACT

A substrate support assembly including a shaft and a susceptor disposed on the shaft. The susceptor is configured to support a substrate in a processing chamber during a substrate processing operation. The substrate support assembly comprises cooling features configured to cool the susceptor at a cooling rate of greater than 2 degrees Celsius per minute subsequent to the substrate processing operation.

18 Claims, 8 Drawing Sheets

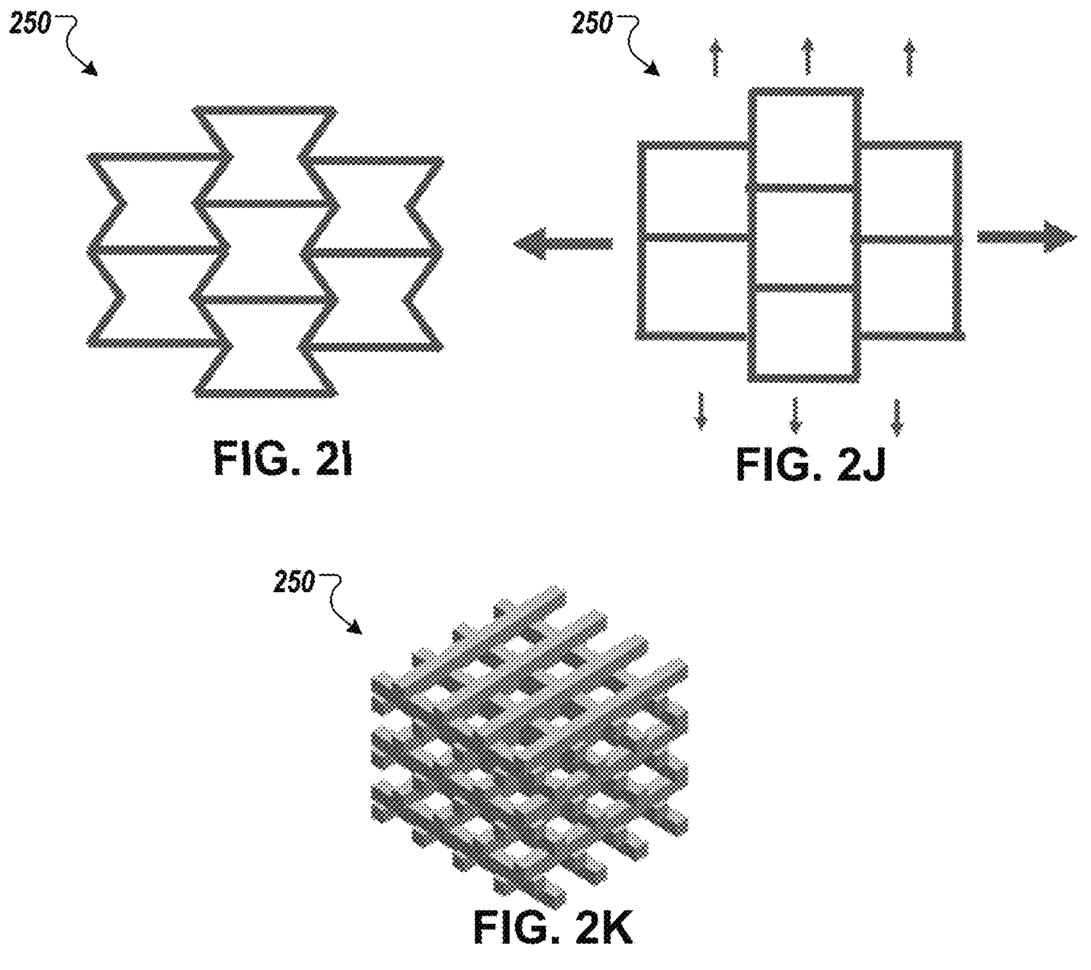
FIG. 2I
FIG. 2J
FIG. 2K
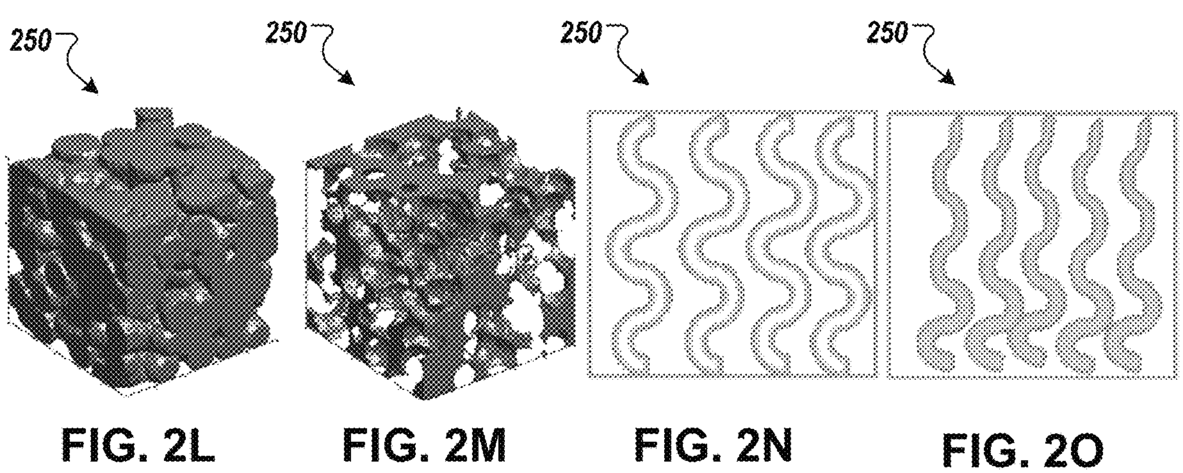
FIG. 2L
FIG. 2M
FIG. 2N
FIG. 2O

SUSCEPTOR HEAT TRANSFER

TECHNICAL FIELD

Embodiments of the present disclosure relate to susceptors, such as those used in association with substrate processing systems, and in particular to susceptor heat transfer.

BACKGROUND

In substrate processing and other electronics processing, processing chambers are used to perform substrate processing operations. Temperatures of substrates in the processing chambers are to be controlled to avoid defects.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a substrate support assembly includes a shaft and a susceptor disposed on the shaft. The susceptor is configured to support a substrate in a processing chamber during a substrate processing operation. The substrate support assembly comprises cooling features configured to cool the susceptor at a cooling rate of greater than 2 degrees Celsius per minute subsequent to the substrate processing operation.

In another aspect of the disclosure, a susceptor is of a substrate support assembly. The susceptor includes an upper surface configured to support a substrate in a processing chamber during a substrate processing operation. The susceptor further includes cooling features configured to cool the susceptor at a cooling rate of greater than 2 degrees Celsius per minute subsequent to the substrate processing operation.

In another aspect of the disclosure, a shaft is of a substrate support assembly. The shaft includes an upper surface configured to be disposed under a susceptor of the substrate support assembly. The shaft further includes cooling features configured to cool the susceptor at a cooling rate of greater than 2 degrees Celsius per minute subsequent to a substrate processing operation.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
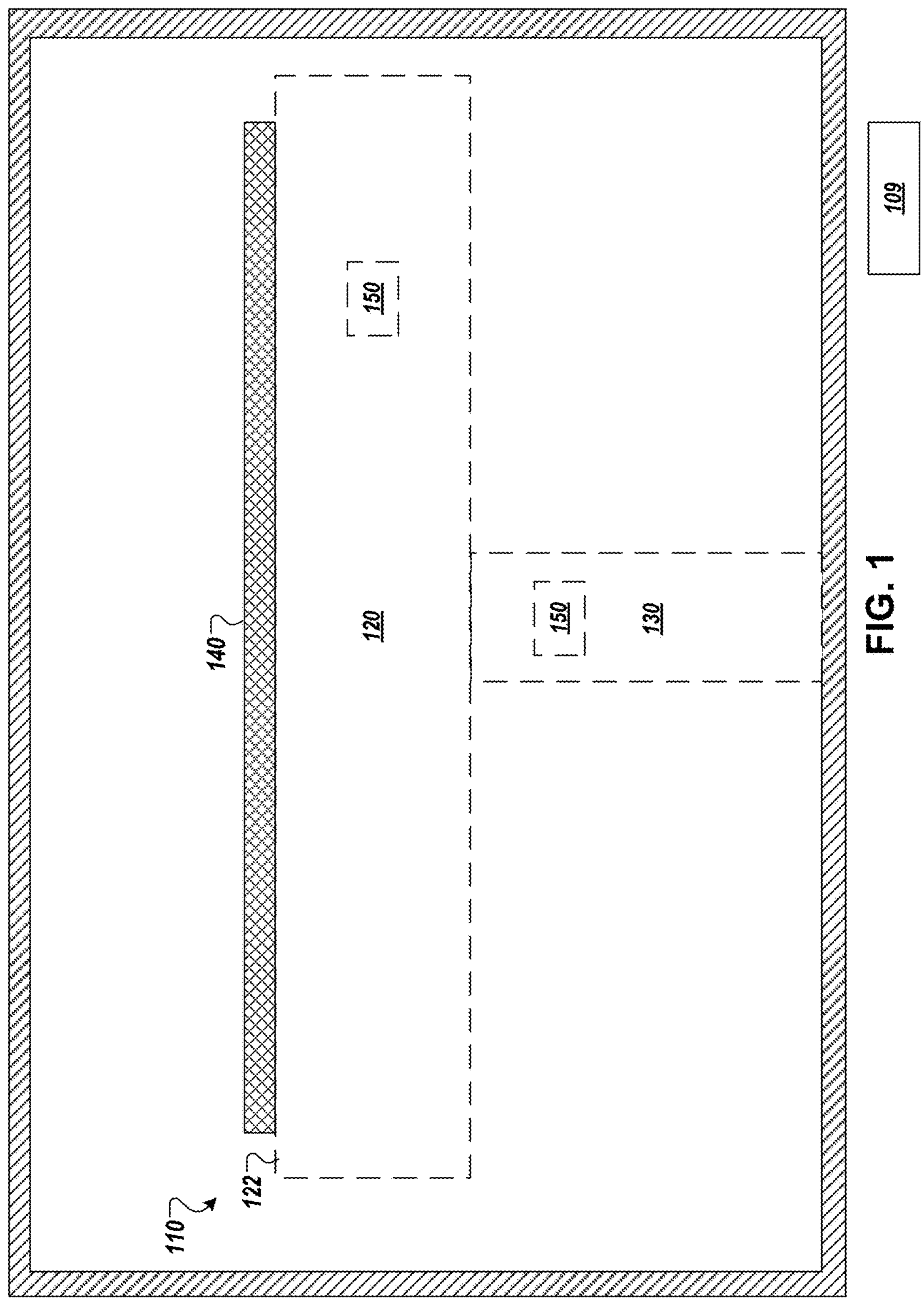
FIG. 1 illustrates a processing chamber that includes a substrate support assembly, according to certain embodiments.

Embodiments described herein are related to susceptor heat transfer (e.g., efficient cooling and heating in an electrostatic chuck (ESC) heater).

Substrate processing systems are used to process substrates. A substrate is transferred into a processing chamber via a robot (e.g., a transfer chamber robot). The processing chamber is sealed and a substrate processing operations (e.g., chemical vapor deposition (CVD), atomic layer deposition (ALD), plasma-enhanced CVD (PECVD), plasma-enhanced ALD (PEALD), etch, etc.) are performed on the substrate. Temperature of the substrate is to be controlled before, during, and after the substrate processing operations. Failure to control the temperature of the substrate results in substrate defects, inconsistent substrate performance, decreased yield, etc.

In conventional systems, a susceptor is used to support a substrate and is used to attempt to control temperature of the substrate. When plasma is formed above the substrate in the processing chamber, the plasma dissipates a large amount of heat and a conventional susceptor is not capable of draining the heat quickly to prevent substrate overheating. Substrate overheating can cause the substrates to not meet threshold values (e.g., be bad wafers).

In conventional systems, after a substrate processing operation, a cleaning operation is performed. If the components (e.g., susceptor) in the processing chamber are not cooled to a threshold temperature, the cleaning agent reacts with the components (e.g., causes particle generation, sublimation of product in the chamber, etc.). This reaction interferes with future substrate processing operations and causes substrates to not meet threshold values (e.g., be bad wafers).

If an extended amount of time is used to allow components (e.g., susceptors) in the processing chamber to cool, this increases queue time, increases energy usage, decreases yield of substrates, and may produce more faulty substrates.

The components, systems, and methods disclosed herein provide susceptor heat transfer (e.g., for high temperature susceptors).

A substrate support assembly includes a shaft and a susceptor (e.g., electrostatic chuck) disposed on the shaft (e.g., one or more components may be disposed between the shaft and the susceptor). The substrate support assembly (e.g., susceptor) is configured to support a substrate (e.g., glass, display, wafer, semiconductor) in a processing chamber (e.g., of a substrate processing system) during a substrate processing operation. The substrate support assembly (e.g., susceptor and/or shaft) includes cooling features that are configured to cool the susceptor at a cooling rate of greater than 2 degrees Celsius (° C.) per minute (° C./min) subsequent to a substrate processing operation. In some embodiments, the substrate processing operation causes the susceptor to be heated to at least 600° C. (e.g., between about 600° C. and about 700° C.) and the cooling features cause the susceptor to cool to at least 400° C. at a cooling rate greater than 2° C./min.

The components, systems, and methods disclosed herein have advantages over conventional solutions. The substrate support assembly of the present disclosure is configured to drain heat quicker to avoid substrate overheating compared to conventional systems. This allows substrates to meet threshold values better than conventional systems. The substrate support assembly of the present disclosure prevents reactions between cleaning agents and components by cooling the components to a lower temperature quicker than conventional solutions. This causes less undesired interference with future substrate processing operations compared to conventional systems. The substrate support assembly of the present disclosure cools components quicker than conventional systems. This increases yield of substrates, decreases queue time, decreases energy usage, and produces less faulty substrates compared to conventional solutions.

Although some embodiments of the present disclosure describe heat transfer for substrates, in other embodiments, similar methods, features, devices, etc. can be used for heat transfer for other components.

FIG. 1 illustrates a processing chamber 100 that includes a substrate support assembly 110, according to certain embodiments. The processing chamber 100 may include one or more walls (e.g., upper wall, lower wall, side walls) that at least partially enclose an interior volume. The substrate support assembly 110 may be disposed in the interior volume of the processing chamber 100.

In some embodiments, the processing chamber 100 is one or more of a plasma treatment chamber, an annealing chamber, deposition chamber, physical vapor deposition (PVD) chamber, chemical vapor deposition (CVD) chamber, ion implantation chamber, etch chamber, deposition chamber (e.g., atomic layer deposition (ALD) chamber, chemical vapor deposition (CVD) chamber, physical vapor deposition (PVD) chamber, and/or plasma enhanced (PE) versions thereof, such as PEALD, PECVD, PEPVD, etc.), anneal chamber, or the like. In some embodiments, the processing chamber has a high density plasma (HDP) source that has a high temperature (e.g., at least 300 degrees Celsius) to provide a massive heat to the substrate.

The substrate support assembly 110 includes a susceptor 120 (e.g., puck, ceramic puck, aluminum nitride block) disposed on (e.g., diffusion bonded to) a shaft 130 (e.g., hollow shaft). A substrate 140 may be disposed on the susceptor 120. The susceptor 120 may include an upper surface 122 configured to support the substrate 140 during a substrate processing operation.

In some embodiments, the susceptor 120 includes one or more of an electrostatic chuck, a vacuum chuck, a susceptor, a workpiece support surface, and/or the like. In some embodiments, the susceptor 120 chucks (e.g., secures) the substrate 140 to an upper surface 122 of the susceptor 120 (e.g., to make secure contact, to make uniform contact, etc. with the susceptor 120). A substrate 140 may refer to a wafer, semiconductor, glass, glass substrate, electronic device, glass device, display device, and/or the like.

The substrate support assembly 110 may have both heating and cooling functions and may be capable of operating at high temperatures (e.g., due to internal heaters, such as resistive heaters) and draining a large amount of external heat within a short amount of time (e.g., due to cooling features 150). The substrate support assembly 110 (e.g., susceptor 120) may be used to support and control the temperature of a substrate 140. When plasma is formed above a substrate 140, the plasma may dissipate a large amount of heat. The substrate support assembly 110 drains the heat quickly to prevent substrate overheating. The present disclosure may combine a heating element (e.g., resistive heater) and cooling features 150 into one or more bodies (e.g., susceptor 120, shaft 130).

In some embodiments, the susceptor 120 is an electrostatic chuck (e.g., electrodes are disposed in the susceptor 120). In some embodiments, one or more heaters (e.g., resistive heaters) are disposed in the susceptor 120 to heat the substrate 140.

The processing chamber 100 may be coupled (e.g., attached, directly connected) to a transfer chamber of a substrate processing system. A robot (e.g., transfer chamber robot, end effector, etc.) may be disposed in the transfer chamber. The robot may transfer the substrate 140 into the processing chamber 100. The substrate 140 may be placed on the susceptor 120. For example, pins of the susceptor 120 may lift the substrate 140 off of the robot, the robot may leave the processing chamber 100, and the pins may lower the substrate 140 onto an upper surface of the susceptor 120. The robot may enter the processing chamber 100 and may remove the substrate 140 from the processing chamber 100. In some embodiments, pins of the susceptor 120 may lift the substrate 140 off of an upper surface of the susceptor 120, the robot may enter the processing chamber 100 and may be disposed under the raised substrate 140, the pins may lower the substrate 140 onto the robot, and the robot may leave the processing chamber 100 with the substrate 140 disposed on the robot. In some embodiments, pins of substrate support assembly 110 are fixed and a substrate 140 is moved by moving the susceptor 120 (e.g., upper surface 122 of susceptor 120 lowers while pins stay fixed). The height of the susceptor 120 may be adjusted via a bellows. The bellows may lower the susceptor 120 while pins maintain the substrate 140 elevated off of an upper surface of the susceptor 120, the robot may enter the processing chamber 100 and may be disposed under the raised substrate 140, the robot may lift the substrate 140 off of the pins, and the robot may leave the processing chamber 100 with the substrate 140 disposed on the robot (e.g., see FIG. 3F).

The susceptor 120 may be configured to support the substrate 140 in the processing chamber 100 during a substrate processing operation. In some embodiments, the substrate support assembly 110 (e.g., susceptor 120, shaft 130) includes cooling features 150 configured to cool the susceptor 120 at a cooling rate of greater than 2 degrees Celsius per minute subsequent to the substrate processing operation. In some embodiments, the substrate support assembly 110 (e.g., susceptor 120, shaft 130) includes cooling features 150 configured to cool the susceptor 120 at a cooling rate of greater than 3 degrees Celsius per minute subsequent to the substrate processing operation. In some embodiments, the substrate support assembly 110 (e.g., susceptor 120, shaft 130) includes cooling features 150 configured to cool the susceptor 120 at a cooling rate of greater than 4 degrees Celsius per minute subsequent to the substrate processing operation. In some embodiments, the substrate support assembly 110 (e.g., susceptor 120, shaft 130) includes cooling features 150 configured to cool the susceptor 120 at a cooling rate of greater than 5 degrees Celsius per minute subsequent to the substrate processing operation. In some embodiments, the substrate support assembly 110 (e.g., susceptor 120, shaft 130) includes cooling features 150 configured to cool the susceptor 120 at a cooling rate of greater than 6 degrees Celsius per minute subsequent to the substrate processing operation. In some embodiments, the substrate support assembly 110 (e.g., susceptor 120, shaft 130) includes cooling features 150 configured to cool the susceptor 120 at a cooling rate of greater than 7 degrees Celsius per minute subsequent to the substrate processing operation. In some embodiments, the substrate support assembly 110 (e.g., susceptor 120, shaft 130) includes cooling features 150 configured to cool the susceptor 120 at a cooling rate of greater than 8 degrees Celsius per minute subsequent to the substrate processing operation. In some embodiments, the cooling features 150 are configured to cool the susceptor 120 from at least 600 degrees Celsius to at least 400 degrees Celsius.

A controller 109 may control one or more methods within the processing chamber 100. For example, the controller 109 may control one or more cooling features 150 to cool the susceptor 120.

In some embodiments, a controller 109 controls various aspects of the substrate support assembly 110, processing chamber 100, robot, one or more control valves, and/or substrate processing system. The controller 109 is and/or includes a computing device such as a personal computer, a server computer, a programmable logic controller (PLC), a microcontroller, and so on. The controller 109 includes one or more processing devices, which, in some embodiments, are general-purpose processing devices such as a microprocessor, central processing unit, or the like. More particularly, in some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. The instructions are stored on a computer readable storage medium, which include one or more of the main memory, static memory, secondary storage and/or processing device (during execution of the instructions). In some embodiments, controller 109 is used to control one or more parameters (e.g., temperature, pressure, flow rate, voltage, etc.) of the substrate support assembly 110. The controller 109 may receive sensor data from one or more sensors associated with the substrate support assembly 110.

In some embodiments, one or more sensors provide sensor data to the controller 109. A sensor may include one or more of a thermocouple sensor, heat sensor, temperature sensor, pressure sensor, flow rate sensor, voltage sensor, pressure sensor, flow rate sensor, and/or the like.

In some embodiments, a system includes the processing chamber 100, substrate support assembly 110, the controller 109, one or more sensors, one or more fluid temperature adjustment devices (e.g., fluid heater, fluid cooler, etc.), and one or more flowrate adjustment devices (e.g., pump, valve, recirculation pump, etc.).

Responsive to the substrate processing equipment being actuated (e.g., turned on, actuated by the controller 109) and/or responsive to controller 109 receiving sensor data (e.g., temperature data) indicating the processing chamber meets a first threshold temperature (e.g., is at an idle state, is below 350 degrees Celsius), the controller 109 may cause a resistive heater 122 to heat the susceptor 120.

Responsive to the substrate processing equipment being actuated (e.g., turned on, actuated by the controller 109) and/or responsive to controller 109 receiving sensor data (e.g., temperature data) indicating the processing chamber meets a second threshold temperature (e.g., is at an active state, is above 350 degrees Celsius), controller 109 may cause a flowrate adjustment device (e.g., pump, recirculation pump, etc.) to cause heat transfer fluid to flow through the shaft 130 and/or susceptor 120.

In some embodiments, the controller 109 further causes a fluid temperature adjustment device (e.g., heater, cooler, condenser, etc.) to cause temperature adjustment of the heat transfer fluid.

The controller 109 controls the temperature of the substrate by controlling the resistive heater 122 and/or the heat transfer fluid in the substrate support assembly 110 to heat and/or cool the substrate 140 and/or susceptor 120. The controller 109 may cause, via one or more cooling features 150, a cooling rate of the susceptor 120 of greater than 2 degrees Celsius per minute subsequent to the substrate processing operation. In some embodiments, the controller 109 may cause, via one or more cooling features 150, cooling of the susceptor 120 from at least 600 degrees Celsius to at least 400 degrees Celsius.

Figure 2A:
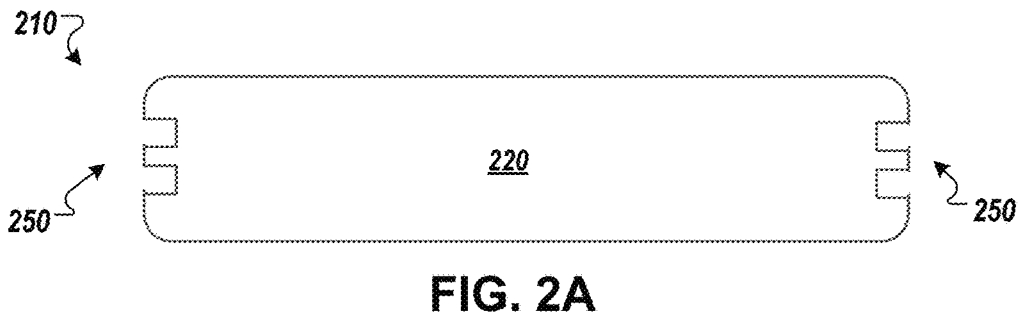
FIGS. 2A-O illustrate cooling features of substrate support assemblies, according to certain embodiments.

FIGS. 2A-O illustrate cooling features 250 (e.g., cooling features 150 of FIG. 1) of substrate support assemblies 210 (e.g., substrate support assembly 110 of FIG. 1), according to certain embodiments. Features of one or more of FIGS. 2A-H that have similar names and/or reference numbers as those in FIG. 1 may have similar or the same structure, functionality, material, etc. as those in FIG. 1.

A substrate support assembly 210 may include a susceptor 220 (e.g., puck, susceptor 120 of FIG. 1) and a shaft 230 (e.g., shaft 130 of FIG. 1). The substrate support assembly 210 may undergo passive cooling by having protrusions (e.g., fins on at least one of the susceptor 220 or the shaft 230) or by incorporating higher thermal conductivity than a conventional puck (e.g., a ceramic puck).

The cooling features 250 may decrease cooling time by decreasing the thermal mass of the susceptor 220 (e.g., puck) compared to a conventional puck. In some embodiments, cooling features 250 include one or more of recesses, protrusions, or surface texturing. Cooling features 250 may allow heat to be transferred from the susceptor 220. The cooling features 250 may be configured to cool the susceptor 220 at a cooling rate of greater than 2 degrees Celsius per minute subsequent to a substrate processing operation. In some embodiments, the cooling features 250 are configured to cool the susceptor 220 from at least 600 degrees Celsius to at least 400 degrees Celsius.

Figure 2B:
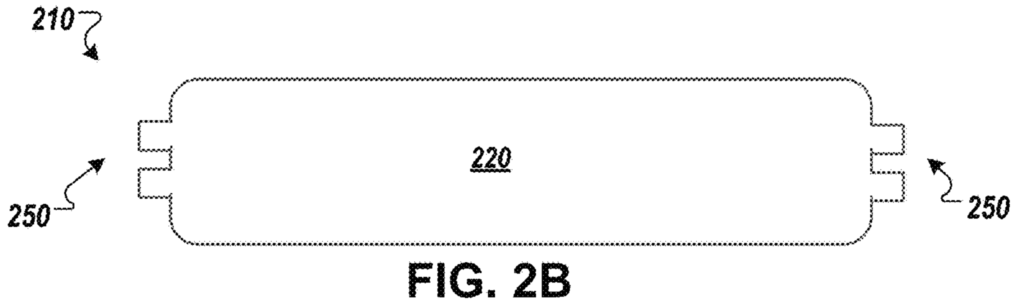

FIGS. 2A-B illustrate susceptors 220 that have cooling features 250 on one or more side surfaces of the susceptor 220, according to certain embodiments. Referring to FIG. 2A, one or more side surfaces of the susceptor 220 form cooling features 250 that include recesses. Referring to FIG. 2B, one or more side surfaces of the susceptor 220 form cooling features 250 that include protrusions.

Figure 2C:
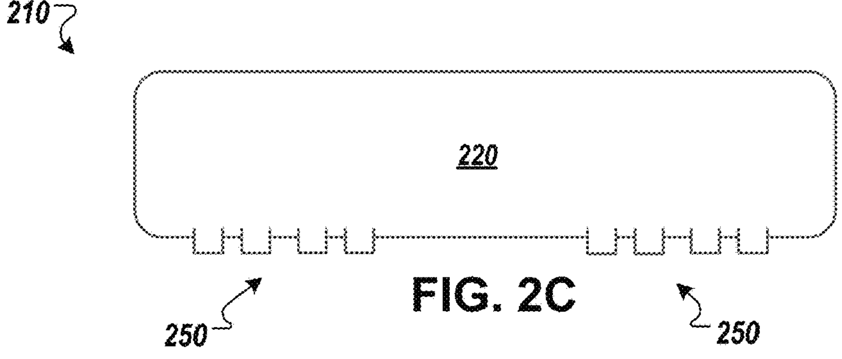
Figure 2D:
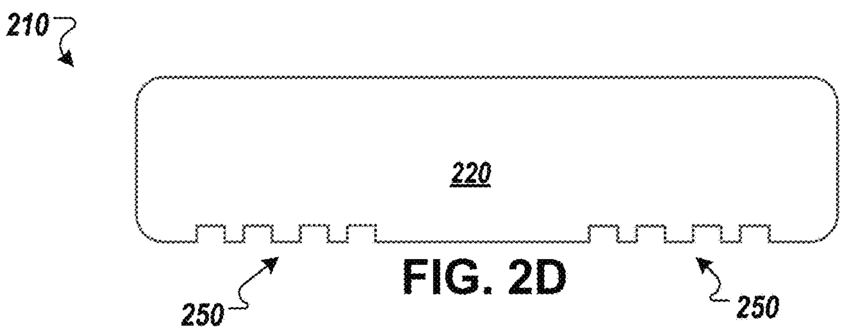

FIGS. 2C-D illustrate susceptors 220 that have cooling features 250 on one or more lower surfaces of the susceptor 220, according to certain embodiments. Referring to FIG. 2C, one or more lower surfaces of the susceptor 220 form cooling features 250 that include protrusions. Referring to FIG. 2D, one or more lower surfaces of the susceptor 220 form cooling features 250 that include recesses. In some embodiments, adjacent components to the susceptor 220 may be textured, such as an inner isolator and/or outer isolator (e.g., see textured inner isolator 392 and/or a textured outer isolator 394 of FIG. 3G.)

Figure 2E:
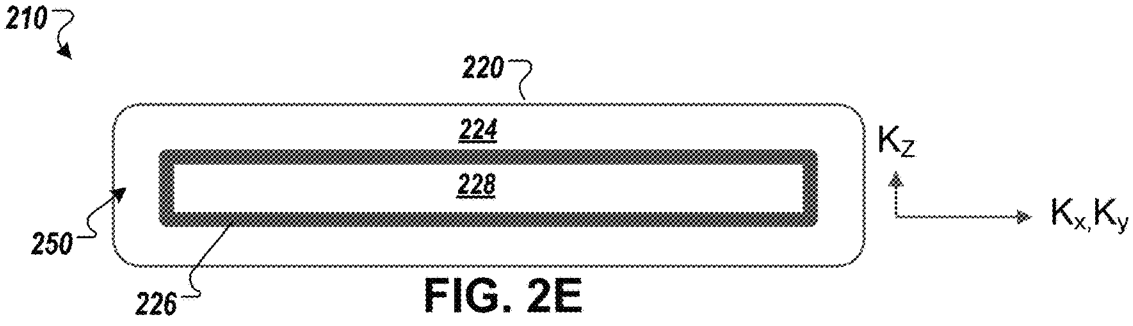
Figure 2F:
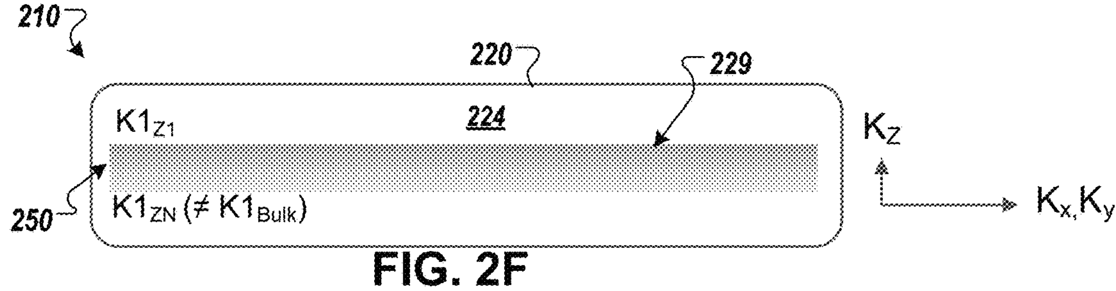
Figure 2G:
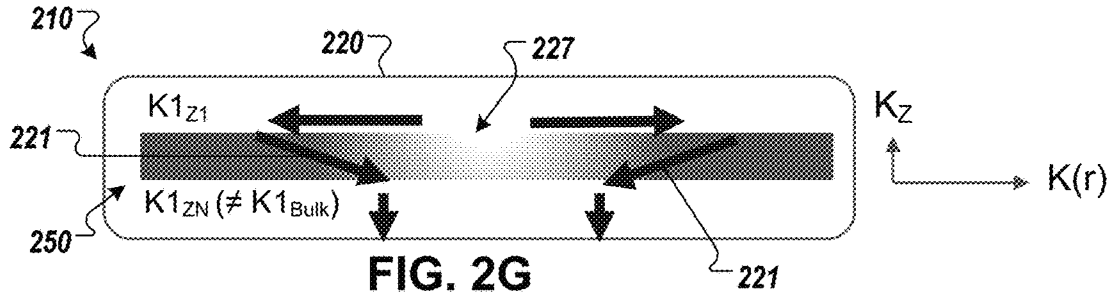

FIGS. 2E-G illustrate susceptors 220 that have a decreased cooling time by using non-homogenous ceramic puck (e.g., anisotropy layers and heat spreaders). Susceptors 220 of FIGS. 2E-G may have a higher thermal conductivity than a conventional puck. One or more of susceptors 220 of FIGS. 2E-G may be made by a powder bed of various materials, via a powder process, via green sheets of different materials that are co-fired, via disposing other materials in an interior volume of a ceramic puck (e.g., upper and lower portions that are fastened together), and/or the like.

FIG. 2E illustrates a susceptor 220 that includes cooling features 250, according to certain embodiments. In some embodiments, the cooling features 250 include a block 228 and encapsulating material 226 (e.g., disposed around the block 228) within a ceramic portion 224 (e.g., disposed around the encapsulating material 226) of the susceptor 220. The block 228 may have a higher thermal conductivity (e.g., high K block) than the ceramic portion 224. In some embodiments, the encapsulating material 226 is formed around the block 228 and the ceramic portion 224 is formed around the encapsulating material 226. In some embodiments, the ceramic portion 224 includes an upper ceramic portion and a lower ceramic portion, where the upper ceramic portion and the lower ceramic portion are attached to each other (e.g., fastened together, adhered to each other, etc.) around the encapsulating material 226 disposed around the block 228. The block 228 and/or the encapsulating material 226 may be one or more of graphite, doped aluminum nitride, etc. In some embodiments, the encapsulating material 226 is a metal doped with matrix material (e.g., aluminum nitride doped with metal or graphite). In some embodiments, the block 228 is a metal.

The block 228, encapsulating material 226, and ceramic portion 224 may each be different materials from each other. The encapsulating material 226 (e.g., intermediate material) may have a coefficient of thermal expansion that is between the coefficient of thermal expansion of the ceramic portion 224 and the coefficient of thermal expansion of the block 228 (e.g., to manage stress on the susceptor 220).

FIG. 2F illustrates a susceptor 220 that includes cooling features 250, according to certain embodiments. In some embodiments, the cooling features 250 include a high thermal conductivity material 229 in a vertical direction. Effective thermal mass of the high thermal conductivity material 229 may decrease (e.g., via doping, via particles oriented in a specific direction, via isentropic material) compared to physical mass of the high thermal conductivity material 229. The high thermal conductivity material may have a higher thermal conductivity than a surrounding ceramic portion 224 (e.g., ceramic material) of the susceptor 220. In some embodiments, an upper portion (e.g., thermal conductivity of $K1_{Z1}$) of the high thermal conductivity material 229 has a higher thermal conductivity (e.g., via doping) than a lower portion (e.g., thermal conductivity of $K1_{ZN}$) of the high thermal conductivity material 229 (e.g., thermal conductivity decreases going from the upper portion to the lower portion). In some embodiments, an upper portion of the high thermal conductivity material 229 has a lower thermal conductivity than a lower portion of the high thermal conductivity material 229 (e.g., thermal conductivity increases going from the upper portion to the lower portion). The thermal conductivity (e.g., $K1_{Z1}$ to $K1_{ZN}$) of any portion of the high thermal conductivity material 229 may not equal the thermal conductivity of the ceramic portion 224 (e.g., $K1_{Bulk}$).

FIG. 2G illustrates a susceptor 220 that includes cooling features 250, according to certain embodiments. In some embodiments, the cooling features 250 may include spatial grading material 227 (e.g., via doping, via particles oriented in a specific direction, via isentropic material) within ceramic material (e.g., ceramic portion 224) of the susceptor 220. The spatial grading material 227 is configured to direct flux (e.g., via doping) to the shaft 230 to accelerate heat conduction (e.g., from the susceptor 220) via the shaft 230. The arrows 221 indicate the heat flow through the susceptor 220. The arrows 221 may pass through portions of highest thermal conductivity in the spatial grading material 227. The spatial grading may cause flux to be directed to accelerate heat conduction from the susceptor 220 to the shaft 230.

Figure 2H:
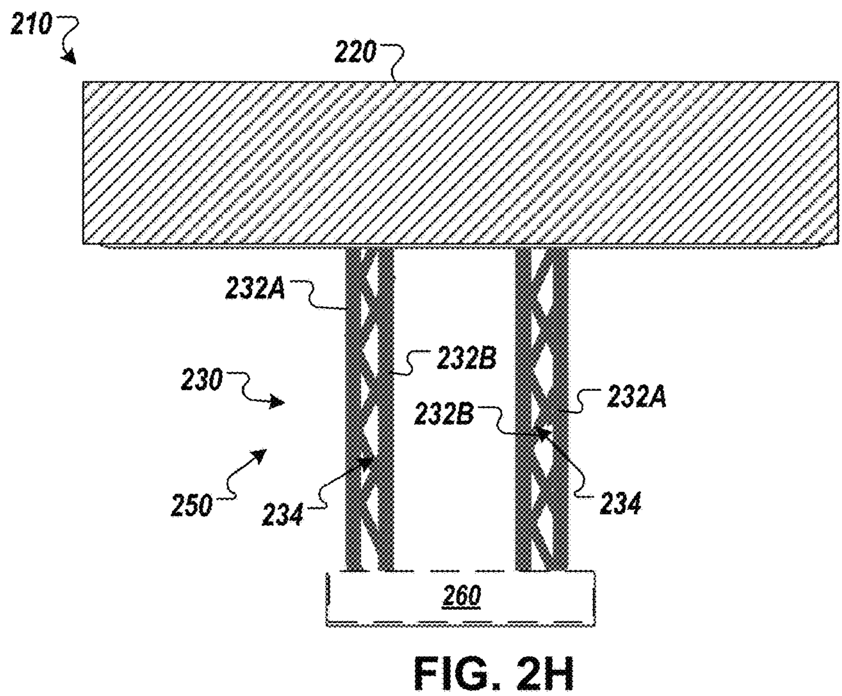

FIG. 2H illustrates a substrate support assembly 210 that includes cooling features 250, according to certain embodiments.

In some embodiments, the shaft 230 includes concentric sidewalls 232A-B (e.g., outer concentric wall 232A and inner concentric wall 232B). The cooling features 250 may include a lattice structure 234 between the concentric sidewalls 23A-B of the shaft 230. The cooling time may be decreased by increasing the conductive heat transfer path (e.g., via lattice structure 234 and/or concentric sidewalls 232A-B). In some embodiments, the concentric sidewalls 232 do not have a lattice structure 234. In some embodiments, there are more than two concentric sidewalls 232 (e.g., and lattice structure 234 between each of the concentric sidewalls 232).

Heat may be transferred from the susceptor 220 to the environment via radiation and heat may be transferred from the susceptor 220 to the shaft 230 via conduction (e.g., via the concentric sidewalls 232 and/or the lattice structure 234). In some embodiments, the shaft 230 is disposed between the susceptor 220 and a heat sink (e.g., heat may travel from the susceptor 220 to the heat sink via conduction through the shaft 230).

FIGS. 2I-O illustrate a substrate support assembly 210 that includes cooling features 250, according to certain embodiments. In some embodiments, the cooling features 250 include a negative Poisson material (e.g., material that has a negative Poisson ratio, auxetic material). In some embodiments, the cooling features 250 include spatial grading material (e.g., spatial grading material 227 of FIG. 2G) that is a negative Poisson material. In some embodiments, the substrate support assembly 210 (e.g., susceptor 120, ceramic portion of the susceptor 120) includes a negative Poisson material (e.g., to improve localized stress rate).

Poisson's ratio may be a measure of the Poisson effect that is the deformation (e.g., expansion or contraction) of a material in directions perpendicular to the specific direction of loading. The value of Poisson's ratio may be the negative of the ratio of transverse strain to axial strain. A material may shrink in the transverse direction when compressed (or expand when stretched) which yields a negative value of the Poisson ratio (e.g., negative Poisson ratio).

The negative Poisson material may be referred to as an auxetic material. When subjected to a positive strain in a longitudinal axis, the transverse strain in the material may be positive (would increase the cross sectional area). For these materials, this may be due to uniquely oriented, hinged molecular bonds. For these bonds to stretch in the longitudinal direction, the hinges may open in the transverse direction, effectively exhibiting a positive strain.

In some embodiments, the substrate support assembly 210 has a cooling design that incorporates a negative Poisson ratio. Conventional substrate support assemblies may have slow cooling rates due to low stress and strain rates of the ceramic material of the substrate support assemblies. Rapid cooling may result in thermal gradients that exceeds the stress and strain rates of the ceramic material and may initiate fractures that result in ceramic cracking.

The cooling features 250 (e.g., negative Poisson material, negative Poisson ratio, etc.) may avoid the fractures and ceramic cracking of conventional substrate support assemblies. In some embodiments, the negative Poisson ratio is incorporated in the bulk of the puck of the substrate support assembly 210. In some embodiments, the negative Poisson ratio material or structure is present throughout the bulk of the puck of the substrate support assembly 210 or partially at predetermined location of the bulk of the puck of the substrate support assembly 210.

A negative Poisson ratio may be implemented for the substrate support assembly 210 by incorporating one or more of lattice structures, fiber reinforcement with predetermined orientation of fibers (e.g., one or more of cross cross pattern, criss-cross pattern, corrugated configuration, etc.).

Topology optimization can be performed into the bulk of the puck of the substrate support assembly 210 that may result in incorporation of predetermined voids or lattice structures (e.g., one or more of honeycomb, Kagome lattice, repeating pattern of cells that allow for expansion in the transverse direction when subjected to axial deformation), re-entrant structures with internal angles less than about 180 degrees, and/or the like.

FIGS. 2I-J illustrate cooling features 250 of substrate support assembly 210, according to certain embodiments. The cooling features 250 of FIGS. 2I-J include negative Poisson material (e.g., material that has a negative Poisson ratio). FIG. 2I illustrates the negative Poisson material not subject to forces (e.g., not undergoing deformation) and FIG. 2J illustrates the negative Poisson material subject to forces (e.g., undergoing deformation).

FIG. 2K illustrates cooling features 250 of substrate support assembly 210, according to certain embodiments. The cooling features 250 of FIG. 2K include a woodpile lattice that may include ceramic material (e.g., AlN). The interlayer material may be amorphous, different ceramic material, fibers, insulator (e.g., air), and/or the like. Cross section of the lattice materials may not be limited to rectangular (e.g., spacing may be a periodic spacing). Density may be non-uniform.

FIGS. 2L-M illustrate cooling features 250 of substrate support assembly 210, according to certain embodiments. The cooling features 250 of FIG. 2L include a ceramic microstructure (e.g., not showing inter grain area). The cooling features 250 of FIG. 2M include an inter grain area in ceramic microstructure (e.g., not showing grains).

FIGS. 2N-O illustrate a cross-sectional views of cooling features 250 of substrate support assembly 210, according to certain embodiments. The cooling features 250 of FIG. 2N include inter-grain area doped with uniform fiber in the ceramic. The cooling features 250 of FIG. 2O include an inter-grain area doped with graded fiber in the ceramic.

FIGS. 3A-G illustrates cooling features 350 (e.g., cooling features 150 of FIG. 1, cooling features 250 of one or more of FIGS. 2A-H) of substrate support assemblies 310 (e.g., substrate support assembly 110 of FIG. 1, substrate support assemblies 220 of one or more of FIGS. 2A-H), according to certain embodiments. Features of one or more of FIGS. 3A-E that have similar names and/or reference numbers as those in FIG. 1 and/or one or more of FIGS. 2A-H may have similar or the same structure, functionality, material, etc. as those in FIG. 1 and/or one or more of FIGS. 2A-H.

Figures 3A, 3B, 3C:
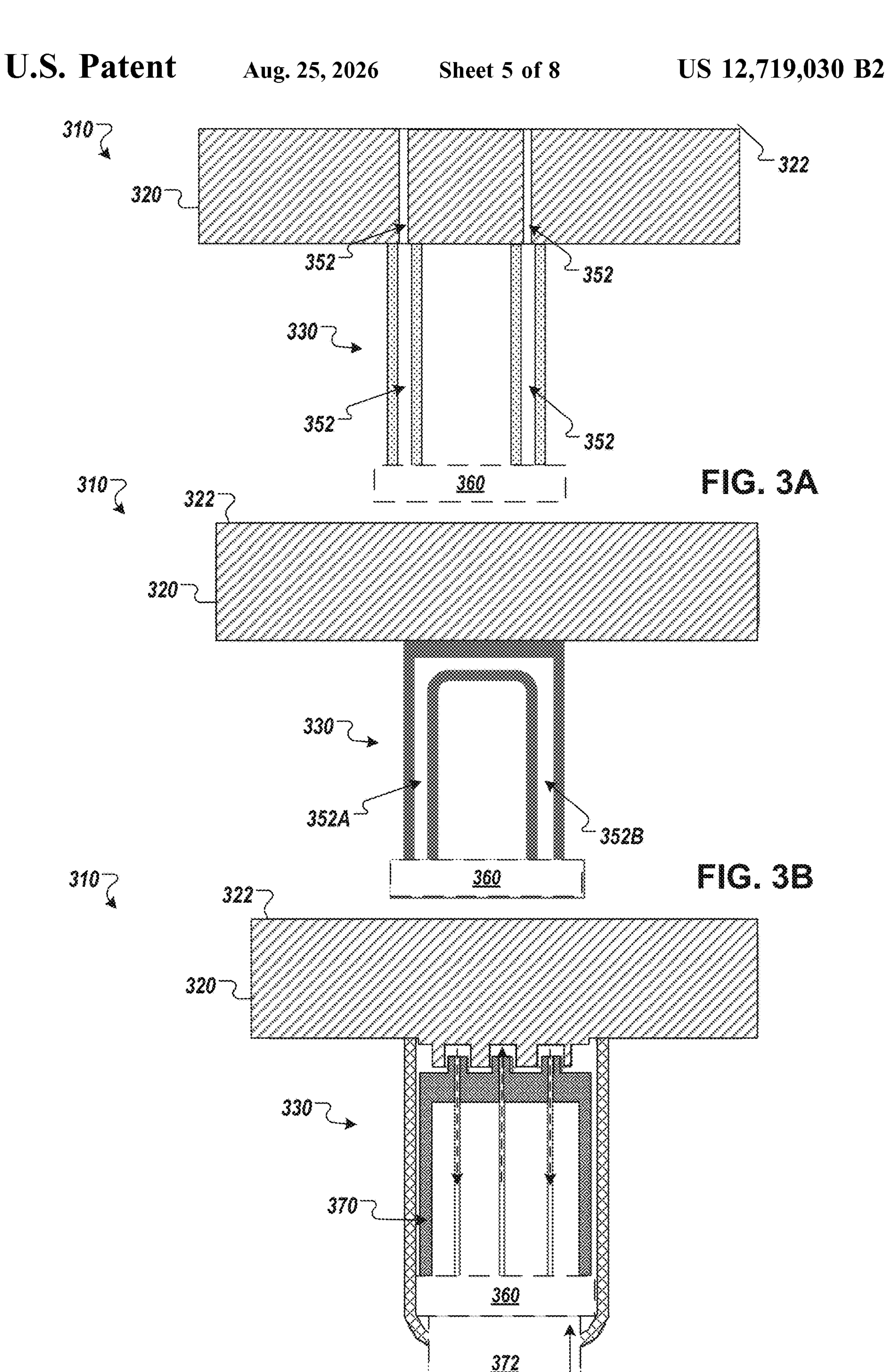
FIGS. 3A-G illustrate cooling features of substrate support assemblies, according to certain embodiments.

Referring to FIGS. 3A-C, fluid may be used to enable active cooling of the susceptor 320. Heat transfer via convection may be caused by fluid (e.g., gas) may flow in the shaft 330 and/or susceptor 320 (e.g., puck). Heat transfer via convection may be caused by fluid (e.g., liquid) in a heat exchanger that can be controlled and/or may be in contact with the susceptor 320 (e.g., puck) or may be proximate the susceptor 320.

FIG. 3A illustrates cooling features of a substrate support assembly 310, according to certain embodiments.

In some embodiments, the cooling features include one or more flow paths 352 formed by the shaft 330 and the susceptor 320. The one or more flow paths 352 are configured to provide inert gas flow through the shaft 330 and through the susceptor 320 to an upper surface 322 of the susceptor 320.

Cooling time may be decreased by incorporating convective heat transfer using coolant (e.g., gas). The gas can flow to an underside of a substrate for cooling and/or backside substrate deposition prevention. In some embodiments, the flow paths 352 (e.g., tubular channels) are connected to each other. In some embodiments, the flow paths 352 are formed by concentric sidewalls of the shaft 330.

In some embodiments, a heat sink 360 is disposed below the shaft 330. In some embodiments, gas flows from heat sink 360, up one flow path 352 formed by shaft 330, through a corresponding flow path 352 formed by susceptor 320, to a location under the substrate (e.g., above the upper surface 322 of susceptor 320), down a different flow path 352 formed by the susceptor 320, down a corresponding flow path 352 formed by the shaft 330, and to heat sink 360. In some embodiments, at least a portion of the gas is dispersed from the susceptor 320 into the processing chamber. In some embodiments, the gas is an inert gas (e.g., nitrogen, argon, helium, etc.).

FIG. 3B illustrates cooling features 350 of a substrate support assembly 310, according to certain embodiments.

In some embodiments, the cooling features include an inlet flow path 352A and an outlet flow path 352B formed by at least one of the shaft 330 or the susceptor 320. The inlet flow path 352A and the outlet flow path 352B are configured to provide liquid (e.g., heat transfer fluid) flow through the at least one of the shaft 330 or the susceptor 320.

The flow paths 352A-B may decrease cooling time of the susceptor 320 by incorporating convective heat transfer using liquid (e.g., heat transfer fluid). The liquid flowing through flow paths 352A-B may cause heat transfer via convection and the shaft 330 and/or heat sink 360 may cause heat transfer via conduction.

In some embodiments, the heat transfer fluid is a synthetic, organic heat transfer medium. In some embodiments, the heat transfer fluid is operable for use in the liquid phase in a closed, forced circulation heat-transfer system. In some embodiments, the heat transfer fluid is operable to be used over a working range (e.g., from about −5 to about 400 degrees Celsius) while being kept under pressure. In some embodiments, the heat transfer fluid has a boiling range at atmospheric pressure that is above about 350 to about 400 degrees Celsius. In some embodiments, the heat transfer fluid is operable to not leave deposits on the walls. In some embodiments, the heat transfer fluid has a density of about 1.0 to about 1.1 (about 1.04 to about 1.05) grams per milliliters density at about 20 degrees Celsius. In some embodiments, the heat transfer fluid has a viscosity of about 42 to about 52 millimeters squared per second at about 20 degrees Celsius. In some embodiments, the heat transfer fluid is compatible with graphite, polytetrafluoroethylene (PTFE), and fluoroelastomers. In some embodiments, the heat transfer fluid is operable to be heated to about 350 to about 400 degrees Celsius. In some embodiments, the heat transfer fluid is operable to be heated to a temperature between about 200 and about 400 degrees Celsius. In some embodiments, the heat transfer fluid is operable to be heated to a temperature between about 200 and about 300 degrees Celsius. In some embodiments, the heat transfer fluid is operable to be heated to a temperature between about 100 and about 200 degrees Celsius. In some embodiments, the heat transfer fluid is operable to be heated to a temperature between about 300 and about 400 degrees Celsius. In some embodiments, the heat transfer fluid is configured to maintain the susceptor 120 within about a ten degree Celsius range during substrate processing. In some embodiments, the substrate support assembly 110 (e.g., the susceptor 120) includes one or more electric resistive heaters in addition to the heat transfer fluid to control temperature of a substrate.

FIG. 3C illustrates cooling features of a substrate support assembly 310, according to certain embodiments.

In some embodiments, the cooling features 350 include an actuator 372 and a heat exchanger 370 disposed below the susceptor 320. The actuator 372 is configured to raise the heat exchanger 370 to be proximate the susceptor 320 to cool the susceptor 320.

The heat exchanger 370 and/or heat sink 360 may be moved closer to the susceptor 320 to transfer heat from the susceptor 320. In some embodiments, a first fluid is flowed proximate the heat exchanger 370 and the susceptor 320 and/or shaft 330 and a second fluid is flowed through the heat exchanger 370. The second fluid may be a chilled fluid (e.g., cryogenic fluid).

Figure 3D:
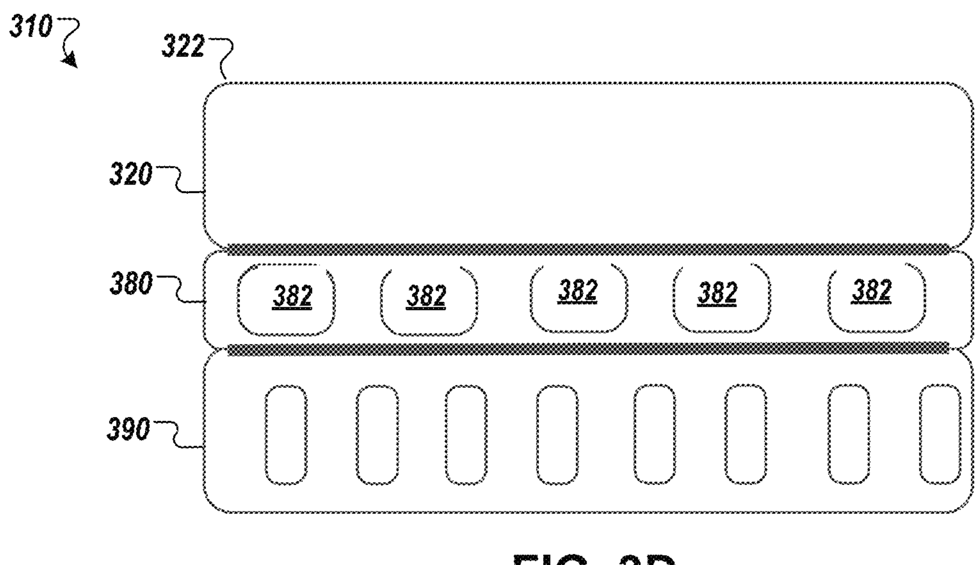

FIG. 3D illustrates cooling features 350 of a substrate support assembly 310, according to certain embodiments.

In some embodiments, the cooling features 350 include a Peltier device 382 configured to direct heat flow away from an upper surface 322 of the susceptor 320 responsive to electrical current flow through the Peltier device 382 in a first direction. The Peltier device 382 may direct heat towards the susceptor 320 responsive to electrical current flow through the Peltier device 382 being in a second direction (e.g., opposite the first direction). Housing 380 may house the Peltier devices 382. Housing 380 may be disposed between susceptor 320 and cooling plate 390. The Peltier devices 382 may direct heat from the susceptor 320 to the cooling plate 390 responsive to the electric current through the Peltier devices 382 being in a first direction. The Peltier devices 382 may direct heat from the cooling plate 390 to the susceptor 320 responsive to the electric current through the Peltier devices 382 being in a second direction. Housing 380 may thermally isolate the cooling plate 390 from the susceptor 320. In some embodiments, Peltier devices 382 use the Peltier effect. In some embodiments, Peltier devices 382 use the Seebeck effect. In some embodiments, the Peltier devices 382 are selectively used to perform zone heating and/or zone cooling.

Cooling time may be decreased by incorporating one or more Peltier devices 382.

Figure 3E:
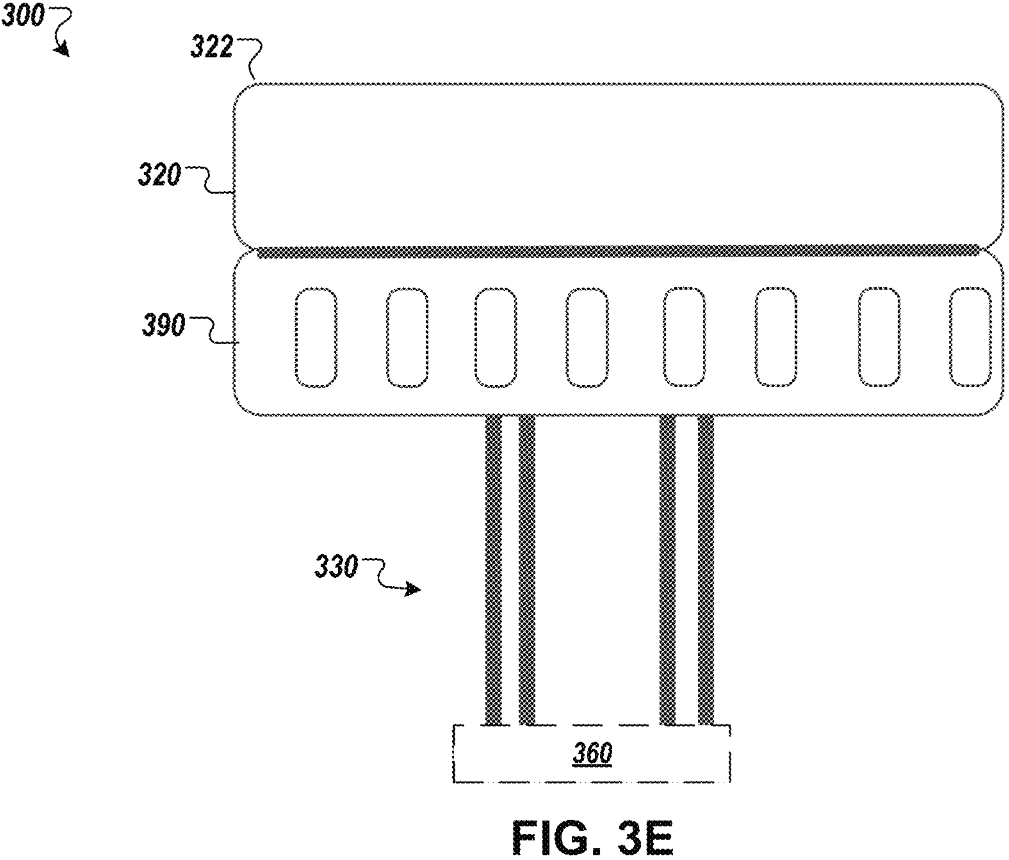

FIG. 3E illustrates cooling features 350 of a substrate support assembly 310, according to certain embodiments. Susceptor 320 may be disposed on a cooling plate 390 that is disposed on a shaft 330 that is disposed on a heat sink 360. Heat may be transferred from the susceptor 320 to the cooling plate 390 to the shaft 330 to the heat sink 360.

Figures 3F, 3G:
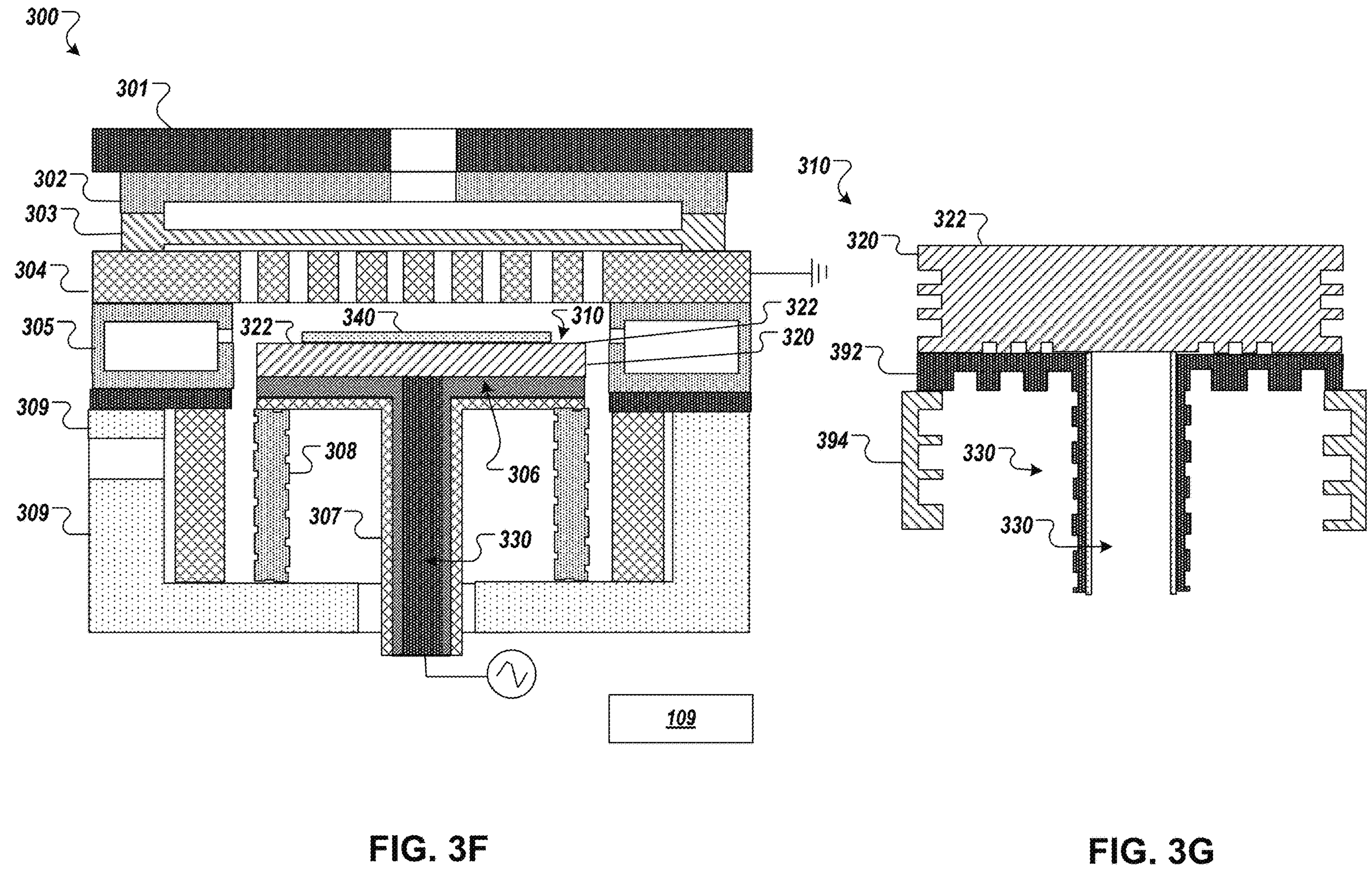

FIG. 3F illustrates cooling features 350 of a substrate support assembly 310 in a processing chamber 300, according to certain embodiments.

Passive cooling with heat sink may be provided along length of the susceptor 320 via texturing in one or more adjacent components (e.g., of the processing chamber 300), such as one or more of lid 301, gas box 302, blocker 303, face plate 304, pumping liner 305, isolation barrier 306, ground bowl 307, flexible radio frequency (RF) ground (GND) 308, and/or chamber walls 309.

FIG. 3G illustrates cooling features 350 of a substrate support assembly 310, according to certain embodiments.

Passive cooling with heat sink may be provided along length of the susceptor 320 via texturing in one or more adjacent components (e.g., of the substrate support assembly 310, of the processing chamber 300), such as one or more of a textured inner isolator 392 (e.g., of the substrate support assembly 310, of the susceptor 320) and/or a textured outer isolator 394 (e.g., of the substrate support assembly 310, of the susceptor 320).

Figure 4:
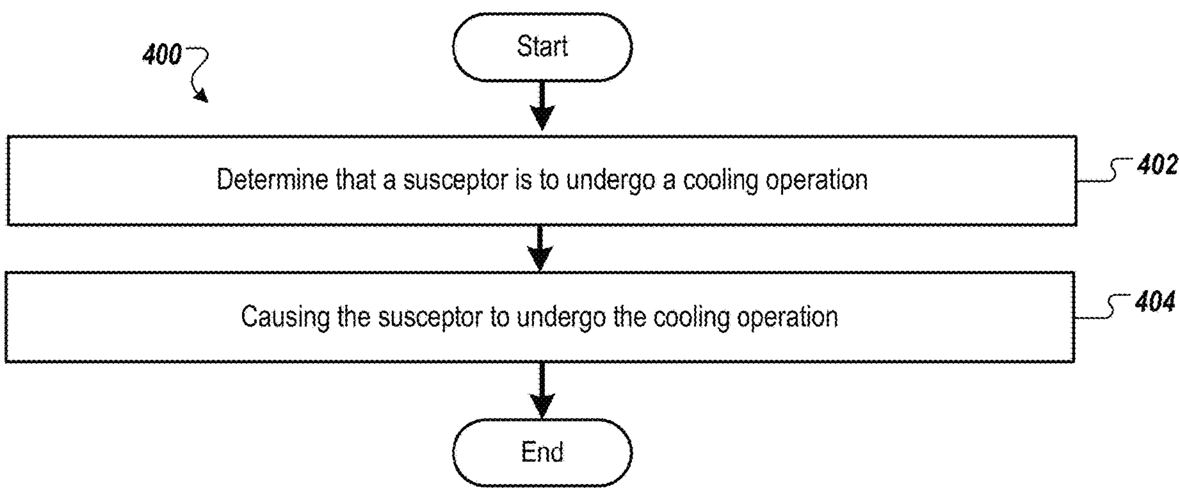
FIG. 4 illustrates a method associated with cooling features of a substrate support assembly, according to certain embodiments.

FIG. 4 illustrates a method 400 associated with cooling features (e.g., cooling features 150 of FIG. 1, cooling features 250 of one or more of FIGS. 2A-H, cooling features 350 of one or more of FIGS. 3A-E) of a substrate support assembly (e.g., substrate support assembly 110 of FIG. 1, substrate support assemblies 210 of one or more of FIGS. 2A-H, substrate support assemblies 310 of one or more of FIGS. 3A-E), according to certain embodiments.

In some embodiments, one or more of operations of method 400 are performed by a controller (e.g., controller 109 of FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

Referring to method 400 of FIG. 4, at block 402, processing logic determines that a susceptor is to undergo a cooling operation. In some embodiments, processing logic determines that the susceptor is to undergo a cooling operation responsive to determining an operation (e.g., substrate processing operation) has completed and/or that an operation (e.g., cleaning operation) is to start.

In some embodiments, processing logic receives sensor data from one or more sensors and determines, based on the sensor data, that the susceptor is to undergo a cooling operation. The sensor data may be associated with a substrate disposed on the substrate support assembly. In some embodiments, the sensor data is associated with temperature of the substrate and/or the susceptor. The processing logic may receive the sensor data from a temperature sensor (e.g., thermocouple).

At block 404, the processing logic causes the susceptor to undergo a cooling operation. In some embodiments, at block 404, the processing logic prevents the heater (e.g., resistive heater) of the substrate support assembly (e.g., susceptor) from heating the substrate support assembly. In some embodiments, at block 404, the processing logic causes fluid (e.g., heat transfer fluid, gas, liquid) to flow through flow paths formed by the susceptor and/or shaft. In some embodiments, at block 404, the processing logic actuates a heat exchanger to be proximate the susceptor. The processing logic may cause, via a fluid temperature adjustment device (e.g., cooler, condenser), temperature adjustment (e.g., cooling) of the fluid (e.g., heat transfer fluid) flowing through the flow paths of the substrate support assembly (e.g., to cool the substrate, to cool the susceptor). The processing logic may cause, via a flowrate adjustment device (e.g., pump, recirculation pump, and/or valve), the fluid (e.g., heat transfer fluid) to flow through the susceptor and/or shaft (e.g., to cool the substrate, to cool the susceptor). The processing logic may cause the flow rate, pressure, and/or temperature of the fluid to cause the susceptor to cool at a cooling rate of at least 2 degrees Celsius per minute.

In some embodiments, each of the operations of method 400 are performed while maintaining a sealed environment in the processing chamber. In some embodiments, the predetermined temperature of the heat transfer fluid, susceptor, shaft, and/or substrate are adjusted based on the temperature of the substrate processing operations. In some embodiments, for each predetermined temperature of the heat transfer fluid, susceptor, shaft, and/or substrate associated with a corresponding substrate processing operation, the temperature of the heat transfer fluid, susceptor, shaft, and/or substrate is maintained within a threshold temperature (e.g., plus or minus ten degrees Celsius) before, during, and after the corresponding substrate processing operation.

Unless specifically stated otherwise, terms such as "causing," determining," "heating," "cooling," flowing," "receiving," "transmitting," "generating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. In some embodiments, such a computer program is stored in a computer-readable tangible storage medium.

The methods and illustrative examples described herein are not inherently related to any particular computer or other apparatus. Various general purpose systems can be used in accordance with the teachings described herein, or a more specialized apparatus can be constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

The terms "over," "under," "between," "disposed on," "support," and "on" as used herein refer to a relative position of one material layer or component with respect to other layers or components. For example, one layer disposed on, over, or under another layer may be directly in contact with the other layer or may have one or more intervening layers. Moreover, one layer disposed between two layers may be directly in contact with the two layers or may have one or more intervening layers. Similarly, unless explicitly stated otherwise, one feature disposed between two features may be in direct contact with the adjacent features or may have one or more intervening layers.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of operations of each method can be altered so that certain operations are performed in an inverse order so that certain operations are performed, at least in part, concurrently with other operations. In another embodiment, instructions or sub-operations of distinct operations are in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate support assembly comprising:

a shaft; and a susceptor disposed on the shaft, wherein the susceptor is configured to support a substrate in a processing chamber during a substrate processing operation, wherein the substrate support assembly comprises cooling features comprising an actuator configured to raise a heat exchanger to be proximate the susceptor, wherein the cooling features are configured to cool the susceptor at a cooling rate of greater than 2 degrees Celsius per minute subsequent to the substrate processing operation.

2. The substrate support assembly of claim 1, wherein the cooling features are configured to cool the susceptor from at least 600 degrees Celsius to at least 400 degrees Celsius.

3. The substrate support assembly of claim 1, wherein the susceptor is an electrostatic chuck.

4. The substrate support assembly of claim 1, wherein:

at least one of a side surface or a lower surface of the susceptor forms one or more of the cooling features; and the one or more of the cooling features comprise one or more of recesses, protrusions, or surface texturing.

5. The substrate support assembly of claim 1, wherein:

the cooling features further comprise a block and encapsulating material within a ceramic portion of the susceptor; and the block has a higher thermal conductivity than the ceramic portion.

6. The substrate support assembly of claim 1, wherein:

the cooling features further comprise a high thermal conductivity material in a vertical direction;

effective thermal mass of the high thermal conductivity material decreases compared to physical mass of the high thermal conductivity material; and the high thermal conductivity material has a higher thermal conductivity than a surrounding ceramic material of the susceptor.

7. The substrate support assembly of claim 1, wherein:

the cooling features further comprise spatial grading material within ceramic material of the susceptor; and the spatial grading material is configured to direct flux to the shaft to accelerate heat conduction via the shaft.

8. The substrate support assembly of claim 1, wherein the susceptor comprises a negative Poisson material.

9. The substrate support assembly of claim 1, wherein:

the shaft comprises concentric sidewalls; and the cooling features further comprise a lattice structure between the concentric sidewalls.

10. The substrate support assembly of claim 1, wherein:

the cooling features further comprise one or more flow paths formed by the shaft and the susceptor; and the one or more flow paths are configured to provide inert gas flow through the shaft and through the susceptor to an upper surface of the susceptor.

11. The substrate support assembly of claim 1, wherein:

the cooling features further comprise an inlet flow path and an outlet flow path formed by at least one of the shaft or the susceptor; and the inlet flow path and the outlet flow path are configured to provide liquid flow through the at least one of the shaft or the susceptor.

12. The substrate support assembly of claim 1, wherein the cooling features further comprise a Peltier device configured to direct heat flow away from an upper surface of the susceptor responsive to electrical current flow through the Peltier device in a first direction.

13. A susceptor of a substrate support assembly, wherein the susceptor comprises:

an upper surface configured to support a substrate in a processing chamber during a substrate processing operation; and cooling features comprising an actuator configured to raise a heat exchanger to be proximate the susceptor, wherein the cooling features are configured to cool the susceptor at a cooling rate of greater than 2 degrees Celsius per minute subsequent to the substrate processing operation.

14. The susceptor of claim 13, wherein:

at least one of a side surface or a lower surface of the susceptor forms one or more of the cooling features; and the one or more of the cooling features comprise one or more of recesses, protrusions, or surface texturing.

15. The susceptor of claim 13, wherein the cooling features further comprise one or more of:

a block and encapsulating material within a ceramic portion of the susceptor, the block having a first higher thermal conductivity than the ceramic portion;

a high thermal conductivity material in a vertical direction, effective thermal mass of the high thermal conductivity material decreasing compared to physical mass of the high thermal conductivity material, the high thermal conductivity material having a second higher thermal conductivity than a surrounding ceramic material of the susceptor; or spatial grading material within ceramic material of the susceptor, the spatial grading material being configured to direct flux to a shaft to accelerate heat conduction via the shaft.

16. A shaft of a substrate support assembly, wherein the shaft comprises:

an upper surface configured to be disposed under a susceptor of the substrate support assembly; and cooling features comprising an actuator configured to raise a heat exchanger to be proximate the susceptor, wherein the cooling features are configured to cool the susceptor at a cooling rate of greater than 2 degrees Celsius per minute subsequent to a substrate processing operation.

17. The shaft of claim 16 further comprising:

an outer concentric wall; and an inner concentric wall disposed within the outer concentric wall, wherein the cooling features further comprise a lattice structure disposed between the outer concentric wall and the inner concentric wall.

18. The shaft of claim 16, wherein the cooling features further comprise one or more of:

one or more flow paths formed by the shaft, the one or more flow paths being configured to provide inert gas flow through the shaft and through the susceptor to an upper surface of the susceptor; or an inlet flow path and an outlet flow path formed by the shaft, the inlet flow path and the outlet flow path being configured to provide liquid flow through the shaft.

* * * * *